United States Patent [19]

Itoh

[11] Patent Number: 5,120,673
[45] Date of Patent: Jun. 9, 1992

[54] PROCESS OF FABRICATING FIELD EFFECT TRANSISTOR WITH LDD STRUCTURE

[75] Inventor: Hiroshi Itoh, Tokyo, Japan

[73] Assignee: NEC Corporation, Tokyo, Japan

[21] Appl. No.: 645,770

[22] Filed: Jan. 25, 1991

[30] Foreign Application Priority Data

Jan. 25, 1990 [JP] Japan ................................ 2-16839

[51] Int. Cl.⁵ ............................................ H01L 21/265
[52] U.S. Cl. .................................. 437/44; 437/41; 437/43; 437/913; 148/DIG. 82
[58] Field of Search ................... 437/41, 44, 43, 913; 357/23.3; 148/DIG. 82

[56] References Cited

U.S. PATENT DOCUMENTS

| | | | |
|---|---|---|---|
| 4,735,680 | 4/1988 | Yen | 437/41 |
| 4,808,544 | 2/1989 | Matsui | 357/23.3 |
| 4,837,180 | 6/1989 | Chao | 437/228 |
| 4,906,589 | 3/1990 | Chao | 437/228 |
| 4,951,100 | 8/1990 | Parrillo | 357/23.3 |
| 4,963,504 | 10/1990 | Huang | 437/41 |
| 4,984,042 | 1/1991 | Pfiester et al. | 357/23.9 |

*Primary Examiner*—Brian E. Hearn
*Assistant Examiner*—Tuan Nguyen
*Attorney, Agent, or Firm*—Sughrue, Mion, Zinn, Macpeak & Seas

[57] ABSTRACT

For formation of the LDD structure with stable impurity profiles, a first ion-implantation using a gate electrode as a mask is carried out through a gate oxide film for doping the semiconductor substrate with impurity atoms, covering the entire surface of the structure with a doped polysilicon film overlain by a protective oxide film, covering the protective oxide film with an intentionally undoped polysilicon film, anisotropically etching the intentionally undoped polysilicon film for forming a side wall on both sides of the side wall, removing exposed portions of the protective oxide film, carrying out a second ion-implantation using the gate electrode and the side wall as a mask for doping the semiconductor substrate with impurity atoms again, thereby forming heavily doped impurity regions partially overlapped with lightly doped impurity regions.

12 Claims, 7 Drawing Sheets

PROCESS OF FABRICATING FIELD EFFECT TRANSISTOR WITH LDD STRUCTURE

FIELD OF THE INVENTION

This invention relates to a process of fabricating a field effect transistor and, more particularly, to a process of fabricating a field effect transistor with a lightly-doped drain structure which is usually abbreviated as "LDD" structure.

DESCRIPTION OF THE RELATED ART

Device scaling promotes large scale integration, and the component field effect transistor scaled down improves characteristics such as, for example, the cutoff frequency. However, a small-sized field effect transistor has a short channel length, and the short channel length causes various undesirable phenomena. The LDD structure provides an effective solution against the undesirable phenomena, and Tiao-yuan Huang et. al. proposes a new LDD structure in "A NOVEL SUBMICRON LDD TRANSISTOR WITH INVERSE-T GATE STRUCTURE", International Electron Devices Meeting Technical Digest, page 742, published in 1986.

Figure 1A:
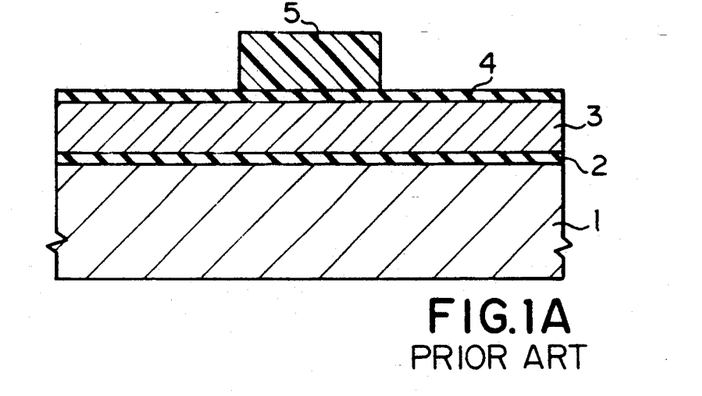
FIGS. 1A to 1F are cross sectional views showing the process sequence of the prior art fabrication process of the field effect transistor with the inverse-T gate structure.

First, description is made of the process of fabricating the field effect transistor with the inverse-T gate structure with reference to FIGS. 1A to 1F. The process sequence starts with preparation of a p-type silicon substrate 1. A thin gate oxide film 2 is grown on the entire surface of the silicon substrate 1, and a polysilicon film 3 is deposited on the entire surface of the gate oxide film 2. The surface of the polysilicon film 3 is oxidized to form a first oxide film 4, and a photo-resist solution is applied on the first oxide film 4. The photoresist film 4 is patterned and formed into a photo-mask 5 provided on the first oxide film 4. The resultant structure is shown in FIG. 1A.

Figure 1B:
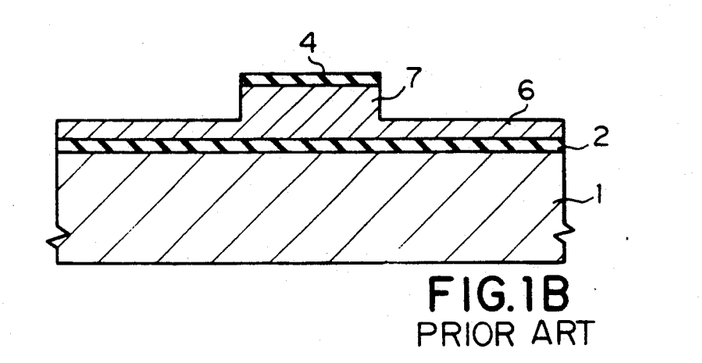

With the photo-mask 5, the first oxide film 4 is partially removed from the structure, and the polysilicon film 3 is further etched away so as to leave a thin polysilicon film 6 on the gate oxide film 2 on both sides of a polysilicon gate electrode 7 as shown in FIG. 1B.

Figure 1C:
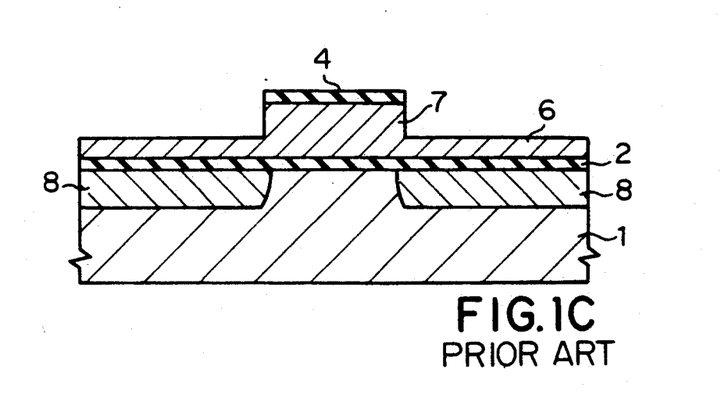

Using the polysilicon gate electrode 7 as a mask, phosphorus atoms are ion-implanted through the thin polysilicon film 6 at dose of $3\times 10^{13}$ cm$^{-2}$, and the acceleration energy is adjusted to 100 KeV. The phosphorus atoms thus implanted form lightly doped n-type impurity regions 8, and the resultant structure is shown in FIG. 1C.

Figure 1D:
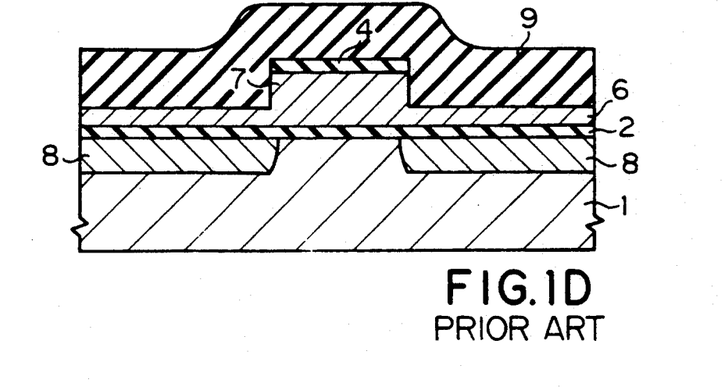
Figure 1E:
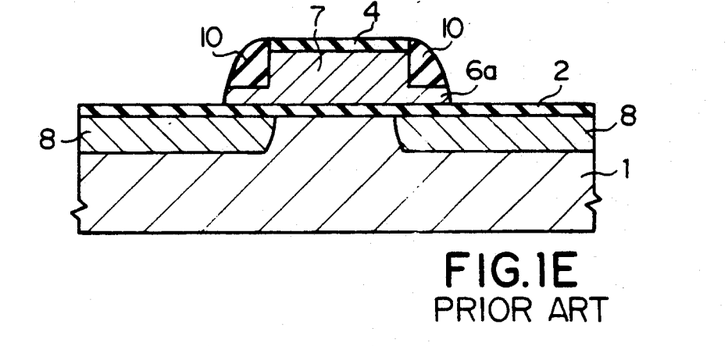
Figure 1F:
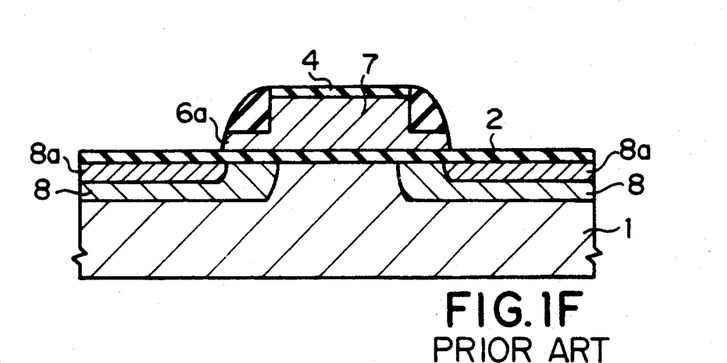

A thick oxide film 9 is uniformly deposited on the entire surface of the structure as shown in FIG. 1D, and the thick oxide film 9 and the thin polysilicon film 6 are anisotropically etched away by using a dry etching technique. A side wall oxide 10 is left on the side surface of the polysilicon gate electrode 7, and a rim portion 6a of polysilicon is also left beneath the side wall oxide 10. The polysilicon gate electrode 7 with the rim portion 6a has generally inverse-T shape as shown in FIG. 1E and is called as an inverse-T gate structure.

Arsenic atoms are, then, ion-implanted into the silicon substrate 1 at dose of $5\times 10^{15}$ cm$^{-2}$ using the inverse-T gate structure as a mask. The acceleration energy is adjusted to 70 KeV, and the arsenic atoms thus implanted form heavily doped n-type impurity regions 8a in the lightly doped n-type impurity regions 8, respectively.

However, a problem is encountered in the prior art field effect transistor with the LDD structure in that the profile of each lightly doped n-type impurity region 8 tends to fluctuate, and the dispersion of impurity concentration and/or dimensions cause the characteristics of the field effect transistor to fluctuate. In other words, an appeciable number field effect transistors tend to be out of the design specification, and, therefore, the prior art process hardly achieves a high production yield. Since the etching process does not proceed uniformly, any smooth surface can not be achieved for the thin polysilicon film 6. This results in that the polysilicon film 6 is irregular in thickness, and the non-uniform polysilicon film 6 varies a projection range of the phosphorus atoms measuring from the major surface of the p-type silicon substrate 1. This is the reason why the device characteristics fluctuate.

SUMMARY OF THE INVENTION

It is therefore an important object of the present invention to provide a process of fabricating a field effect transistor with the LDD structure having a stable impurity profile.

To accomplish these objects, the present invention proposes to ion-implant through a film or films which are never subjected to etching.

In accordance with the present invention, there is provided a process of fabricating a field effect transistor comprising the steps of: a) preparing a semiconductor substrate of a first conductivity type having a major surface; b) forming a gate oxide film on the major surface; c) forming a gate electrode on a predetermined portion of the gate oxide film; d) carrying out a first ion-implantation through the gate oxide film for doping the semiconductor substrate with impurity atoms of a second conductivity type opposite to the first conductivity type, thereby forming lightly doped impurity regions, the gate electrode serving as a mask during the first ion-implantation; e) covering the entire surface of the structure with a doped polysilicon film overlain by a protective oxide film; f) covering the protective oxide film with an intentionally undoped polysilicon film; g) anisotropically etching the intentionally undoped polysilicon film for forming a side wall on a portion of the protective oxide film covering a side surface of the gate electrode, the protective oxide film being exposed on both sides of the side wall; h) removing exposed portions of the protective oxide film; i) carrying out a second ion-implantation using the gate electrode and the side wall as a mask for doping the semiconductor substrate with impurity atoms of the second conductivity type, thereby forming heavily doped impurity regions; and j) removing the side wall.

The exposed portions of the doped polysilicon film may be removed after either step h) or i).

BRIEF DESCRIPTION OF THE DRAWINGS

The features and advantages of a process of fabricating a field effect transistor with the LDD structure according to the present invention will be more clearly understood from the following description taken in conjunction with the accompanying drawings in which.

DESCRIPTION OF THE PREFERRED EMBODIMENTS

First Embodiment

Figure 2A:
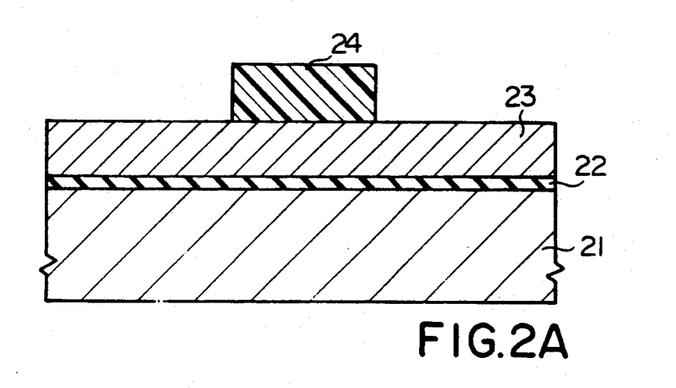
FIGS. 2A to 2F are cross sectional views showing the of a process for fabricating a field effect transistor with the LDD structure according to the present invention.

A process according to the present invention starts with preparation of a lightly doped p-type single crystalline silicon substrate 21. On the entire major surface of the silicon substrate 21 is grown a gate oxide film 22 to a thickness of about 15 nanometer, and a polysilicon film 23 is deposited on the gate oxide film 22 to a thickness of about 300 nanometer. A photoresist solution is, by way of example, spun onto the entire surface of the polysilicon film 23, and the photoresist film is patterned through lithographic techniques for forming a photoresist mask 24 as shown in FIG. 2A.

Figure 2B:
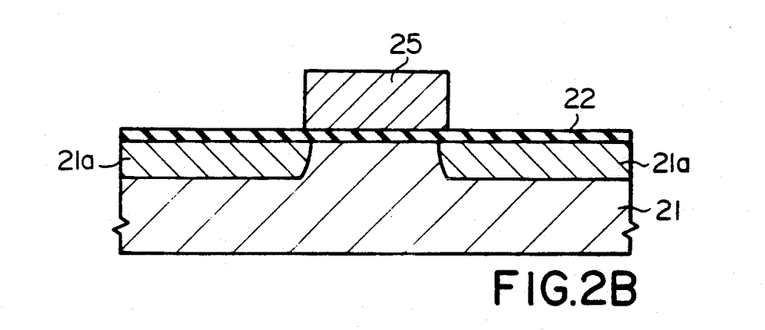

Using the photoresist mask 24, the polysilicon film 23 is anisotropically etched until the gate oxide film 22 is exposed, and a plasma etching technique is applied for patterning the polysilicon film 23. The photoresist mask 24 is, then, stripped off, and a polysilicon gate electrode 25 is formed on the gate oxide film 22. Using the polysilicon gate electrode as a mask, phosphorus atoms are ion-implanted into the surface portion of the silicon substrate 21 at dose of about $5 \times 10^{12}$ cm$^{-2}$, and the acceleration energy is adjusted to about 50 KeV. This results in lightly doped n-type impurity regions 21a serving as source and drain regions, and the impurity density of the n-type regions 21a ranges from about $10^{17}$ cm$^{-3}$ to about $10^{20}$ cm$^{-3}$. Since the polysilicon gate electrode 25 is exposed to the radiation of phosphorus atoms, the conductivity of the polysilicon gate electrode 25 is improved. The resultant structure of this stage is shown in FIG. 2B. The ion implantation is carried out through the thin gate oxide film 22 only, and the surface of the thin gate oxide film 22 is much smoother than the polysilicon layer 6, because the gate oxide film 22 is never subjected to any etching process. This results in that the impurity profile is stable, and, for this reason, the device characteristics do not fluctuate.

Figure 2C:
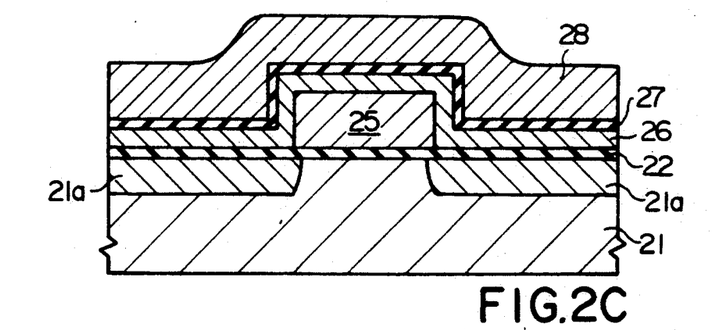

After the formation of the lightly doped n-type impurity regions 21a, a phosphorus-doped thin polysilicon film 26 is deposited to a thickness of about 100 nanometer, and the phosphorus-doped thin polysilicon film 26 is covered with a silicon oxide film 27 as thin as about 10 nanometer. In this instance, the silicon oxide film 27 is formed by using a deposition technique. In another process sequence, the silicon oxide film 27 may be formed through thermal oxidation of the thin phosphorus doped polysilicon film 26. A thick non-doped polysilicon film 28 is further deposited over the entire surface of the silicon oxide film 27, and the resultant structure is shown in FIG. 2C. The word "non-doped" means intentionally undoped.

Figure 2D:
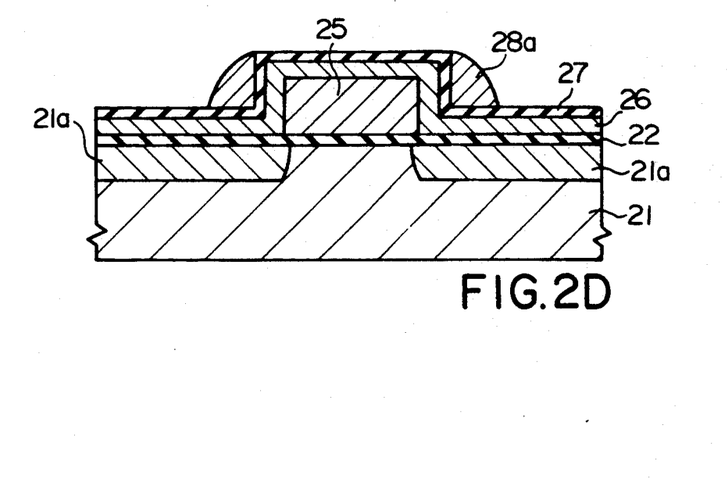

Subsequently, the thick non-doped polysilicon film 28 is anisotropically etched away by using a plasma etching technique, and a non-doped polysilicon side wall 28a is left on the step portion of the thin silicon oxide film 27 covering the side surface of the polysilicon gate electrode 25. The resultant stage of this stage is shown in FIG. 2D.

Using the non-doped polysilicon side wall 28a as a mask, the thin silicon oxide film 27 and the phosphorus doped polysilicon film 26 are etched away. While the phosphorus doped polysilicon film 26 is etched way, the non-doped polysilicon side wall 28a may be also slightly etched, however, no substantial deformation takes place, because the etching rate is different between the non-doped polysilicon and the phosphorus doped polysilicon. The remaining silicon oxide film 27a and the remaining phosphorus doped polysilicon film 26a form a side wall structure 29 together with the non-doped polysilicon side wall 28a. The non-doped polysilicon film 28, the thin silicon oxide film 27 and the phosphorus doped polysilicon film 26 may be anisotropically etched in succession, and such a successive anisotropical ion etching also results in the side wall structure 29. The successive anisotropical etching may be desirable for forming a predetermined configuration.

Figure 2E:
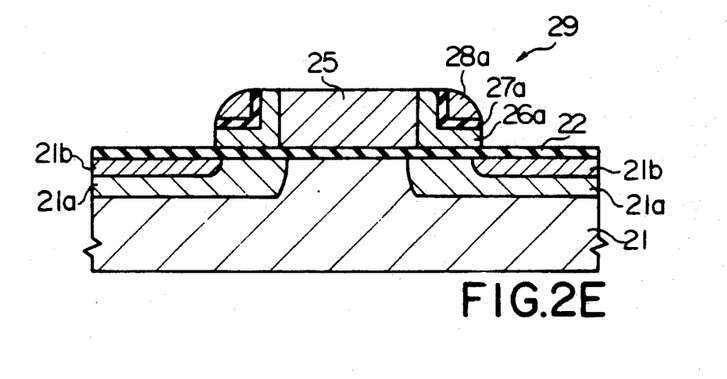

Using the side wall structure 29 as a mask again, arsenic atoms are ion-implanted into the silicon substrate 21 at dose of about $5 \times 10^{15}$ cm$^{-2}$, and the acceleration energy is adjusted to about 70 KeV. Then, heavily doped n-type impurity regions 21b are respectively formed in the lightly doped n-type impurity regions 21a, and the LDD structure is completed in the silicon substrate 21 as shown in FIG. 2E. The ion implantation is carried out through the thin gate oxide film 22 only, and the impurity profile of each heavily doped n-type impurity region 21b is stable, because the thin gate oxide film 22 is substantially uniform in thickness.

Figure 2F:
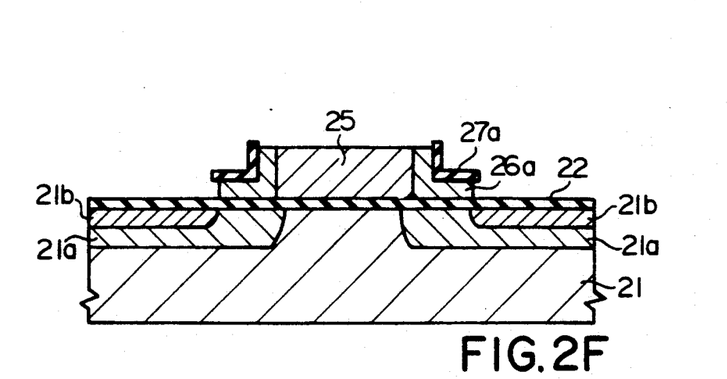

If the polysilicon side wall 28a is left on the remaining silicon oxide film 27a, the polysilicon side wall 28a tends to serve as a floating gate electrode. For this reason, the polysilicon side wall 28a is removed by using a wet etching technique. While the polysilicon side wall 28a is removed, the top surface of the poly silicon gate electrode 25 is slightly etched, and the side surface of the remaining phosphorus doped polysilicon 26a is also slightly etched way as shown in FIG. 2F. However, such a small amount of etching has no influence on the field effect transistor, because the LDD structure has been already completed. Although the leading end of the remaining phosphorus doped polysilicon film 26a slightly retracts toward the polysilicon gate electrode 25, the amount of retraction is negligible, and the device characteristics are never affected by the retraction.

Figure 3:
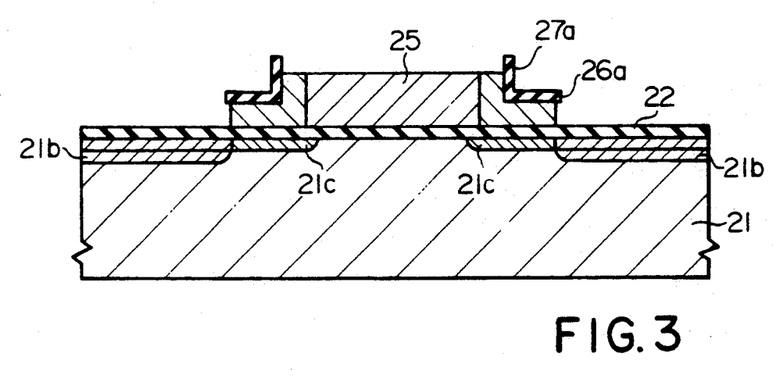
FIG. 3 is a cross sectional view showing a field effect transistor with the LDD structure fabricated through the process sequence shown in FIGS. 1A to 1F but the conditions of ion implantation are modified.

The process sequence described hereinbefore results in the LDD structure where the heavily doped n-type impurity regions 22b are perfectly accommodated in the respective lightly doped n-type impurity regions 22a. However, various LDD structures are produced by adjusting the conditions of the ion implantation. For example, if the phosphorus atoms are ion-implanted at dose of about $5 \times 10^{12}$ cm$^{-2}$ with acceleration energy of about 40 KeV, shallow lightly doped n-type impurity regions 21c take place in the surface portion of the silicon substrate 21, and the heavily doped n-type impurity regions 21b penetrate the associated shallow lightly doped n-type impurity regions 21c as shown in FIG. 3.

Second Embodiment

Figure 4A:
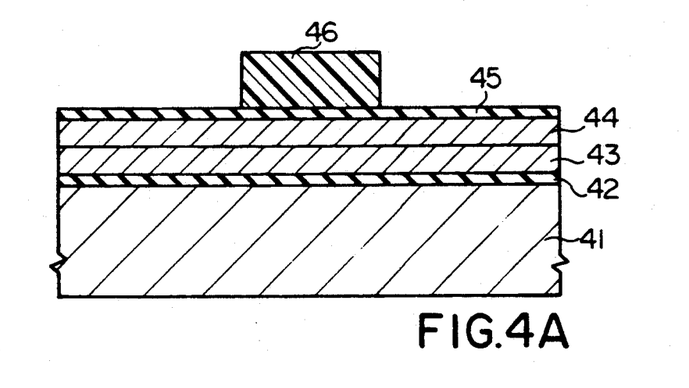
FIGS. 4A to 4F are cross sectional views showing the sequence of still another process according to the present invention.

FIGS. 4A to 4F illustrate another process sequence according to the present invention. The process sequence shown in FIGS. 4A to 4F is preferable for fabricating a field effect transistor with a polycide gate structure and also starts with preparation of a lightly doped p-type single crystal silicon substrate 41. The major surface of the silicon substrate 41 is thermally oxidized, and a thin gate oxide film 42 covers the major surface. On the gate oxide film 42 are successively deposited a phosphorus doped polysilicon film 43, a tungsten silicide film 44 and a first thin oxide film 45, and a photoresist solution is spun onto the first thin oxide film 45. The photoresist film is patterned through lithographic techniques, and a photoresist mask 46 is provided on the first thin oxide film 45. the resultant structure of this stage is shown in FIG. 4A.

Figure 4B:
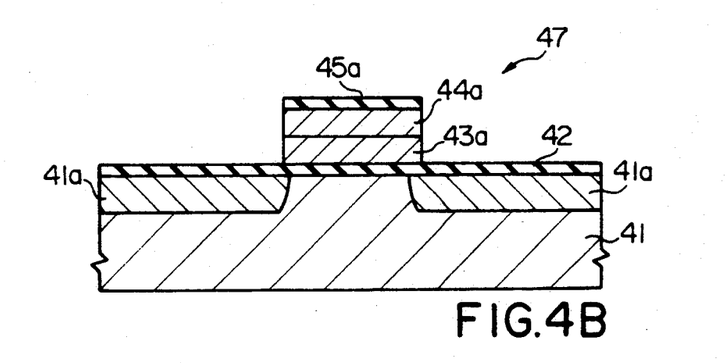

Using the photomask 46 as a mask, the first thin oxide film 45, the tungsten silicide film 44 and the phosphorus doped polysilicon film 43 are partially removed through anisotropical plasma etching technique, and the photoresist mask 46 is stripped off. The remaining first thin oxide film 45a, the remaining tungsten silicide film 44a and the remaining phosphorus doped polysilicon film 43a form in combination a polycide gate electrode 47. Using the polycide gate electrode 47 as a mask, phosphorus atoms are ion-implanted into the silicon substrate 41 at dose of about $5 \times 10^{12}$ cm$^{-3}$ with acceleration energy of about 50 KeV. Then, lightly doped n-type impurity regions 41a are formed in the surface portion of the silicon substrate 41, and the lightly doped n-type impurity regions 41a range from about $10^{17}$ cm$^{-3}$ to about $10^{20}$ cm$^{-3}$. The resultant structure of this stage is shown in FIG. 4B. Since the thin gate oxide film 42 is never subjected to etching, the thin gate oxide film 42 is substantially uniform in thickness, and the ion implantation surely results in a stable impurity profile, because the projection range of the implanted impurity atoms are substantially constant with respect to the major surface of the silicon substrate 41.

Figure 4C:
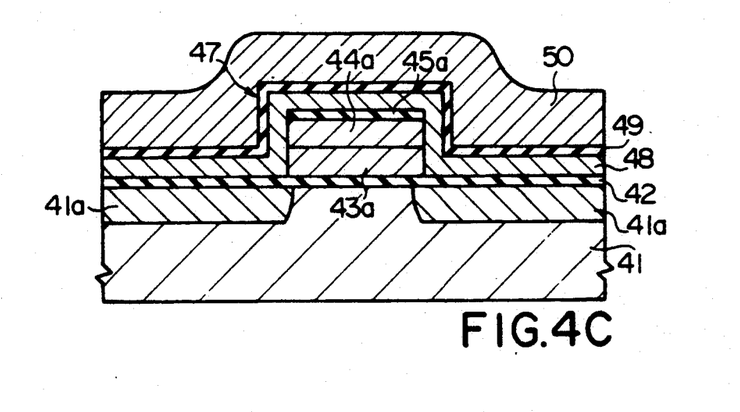

On the entire surface of the structure are successively deposited a phosphorus doped polysilicon film 48, a thin silicon oxide film 49 and an intentionally undoped polysilicon film 50 which are about 100 nanometer thick, about 10 nanometer thick and about 300 nanometer thick, respectively. The resultant structure of this stage is shown in FIG. 4C.

Figure 4D:
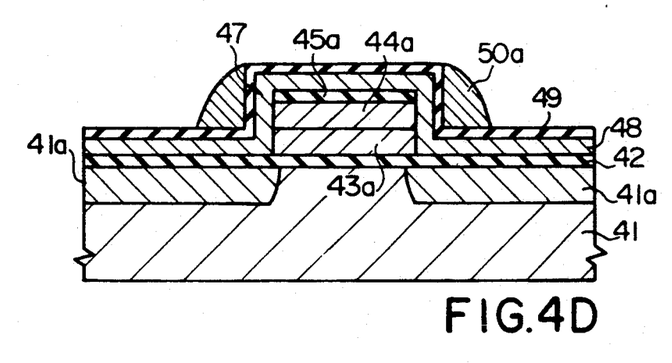

Anisotropical plasma etching is applied to the thick intentionally undoped polysilicon film 50, and the thick intentionally undoped polysilicon film 50 is removed until the thin silicon oxide film 49 is exposed. Since the plasma etching is anisotropical, a side wall 50a is left on the step portion of the silicon oxide film 49 covering the side surface of the polycide gate electrode 47. The resultant structure of this stage is shown in FIG. 4D.

Figure 4E:
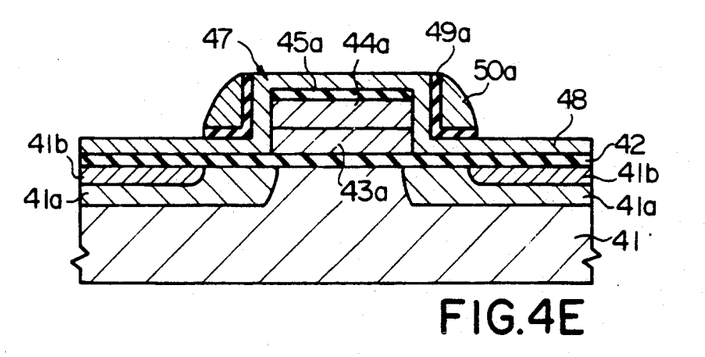

Using the side wall 50a as a mask, the thin silicon oxide film 49 is etched away, and arsenic atoms are ion-implanted into the silicon substrate 41 at dose of about $5 \times 10^{15}$ cm$^{-2}$ with acceleration energy of about 100 KeV. Although the ion implantation is carried out through the thin phosphorus doped polysilicon film 48 and the thin gate oxide film 42, the impurity profile hardly fluctuates, because not only the thin gate oxide film 42 but also the thin phosphorus doped polysilicon film 48 have never been subjected to any etching process. Moreover, since damages due to the ion implantation take place in the thin phosphorus doped polysilicon film 48, the field effect transistor thus fabricated is free from any junction leakage, and the properties such as hold time are improved. The ion implantation of arsenic atoms forms heavily doped n-type impurity regions 41b, and the heavily doped n-type impurity regions 41b are formed in the lightly doped n-type impurity regions 41a, respectively. The heavily doped n-type impurity regions 41b are shallower than those of the first embodiment in so far as the acceleration energy is adjusted to the same level.

Figure 4F:
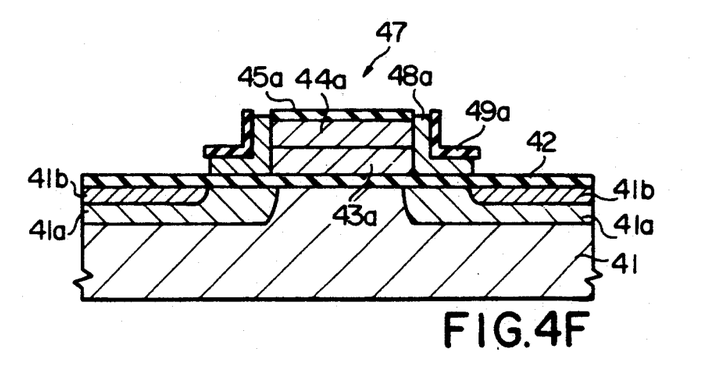

Finally, the exposed portions of the phosphorus doped polysilicon film 48 and the side wall 50a is removed from the structure by using a wet etching. While the polysilicon side wall 50a is etched away, the thin phosphorus doped polysilicon film 48a is also slightly etched, but the wet etching has no influence on the polycide gate electrode 47 because of the thin silicon oxide film 45a. Even though the thin phosphorus doped polysilicon film 48a is slightly etched, the impurity profiles and the device characteristics are not affected by the retraction.

As will be understood from the foregoing description, since the process according to the present invention allows the ion implantation to be carried out through the gate oxide film or the gate oxide film overlain by the thin phosphorus doped polysilicon film uniform in thickness, the impurity profiles are stable, and the device characteristics are easily fallen within a design specification. This improves the production yield of the field effect transistor with the inverse-T gate electrode.

Although particular embodiments of the present invention have been shown and described, it will be obvious to those skilled in the art that various changes and modifications may be made without departing from the spirit and scope of the present invention. For example, the thin phosphorus doped polysilicon film 26 may be replaced with a polycide film or a combination of a polysilicon film and a refractory metal silicide film.

What is claimed is:

1. A process of fabricating a field effect transistor comprising the steps of:
   a) preparing a semiconductor substrate of a first conductivity type having a major surface;
   b) forming a gate oxide film on said major surface;
   c) forming a gate electrode on a predetermined portion of said gate oxide film;
   d) carrying out a first ion-implantation through said gate oxide film for doping said semiconductor substrate with impurity atoms of a second conductivity type opposite to said first conductivity type, thereby forming lightly doped impurity regions, said gate electrode serving as a mask during said first ion-implantation;
   e) covering the entire surface of the structure with doped polysilicon film overlain by a protective oxide film;
   f) covering said protective oxide film with an intentionally undoped polysilicon film;
   g) anisotropically etching said intentionally undoped polysilicon film for forming a side wall on a portion of said protective oxide film covering a side surface of said gate electrode, said protective oxide film being exposed on both sides of said side wall;
   h) removing exposed portions of said protective oxide film substantially without etching said doped polysilicon;
   i) carrying out a second ion-implantation through said doped polysilicon using said gate electrode and said side wall as a mask for doping said semiconductor substrate with impurity atoms of said second conductivity type, thereby forming heavily doped impurity regions; and
   j) removing said side wall.

2. A process as set forth in claim 1, in which said heavily doped impurity regions are formed in surface portions of said lightly doped impurity regions, respectively.

3. A process as set forth in claim 2, in which said gate electrode is formed of polysilicon and doped with said impurity atoms in said first ion-implantation.

4. A process as set forth in claim 3, in which said intentionally undoped polysilicon film is anisotropically etched by using a plasma etching technique.

5. A process as set forth in claim 4, in which said exposed portions of said protective oxide film and said exposed portions of said doped polysilicon film are successively etched by using said plasma etching technique.

6. A process as set forth in claim 4, in which phosphorus atoms and arsenic atoms are used in said first and second ion-implantations, respectively.

7. A process as set forth in claim 1, in which said lightly doped impurity regions are shallower than said heavily doped impurity regions.

8. A process as set forth in claim 1, in which exposed portions of said doped polysilicon film are removed after said step i).

9. A process as set forth in claim 8, in which said heavily doped impurity regions are respectively formed in surface portions of said lightly doped impurity regions.

10. A process as set forth in claim 9, in which said gate electrode is constituted by a combination of a polysilicon film, a film of a refractory metal silicide and an oxide film.

11. A process as set forth in claim 10, in which said intentionally undoped polysilicon film is anisotropically etched by using a plasma etching technique.

12. A process as set forth in claim 11, in which phosphorus atoms and arsenic atoms are used in said first and second ion-implantations, respectively.

* * * * *